(12) United States Patent
Mihara

(10) Patent No.: US 8,278,734 B2
(45) Date of Patent: Oct. 2, 2012

(54) SEMICONDUCTOR DEVICE AND MANUFACTURING METHOD THEREOF

(75) Inventor: Ichiro Mihara, Tachikawa (JP)

(73) Assignee: Teramikros, Inc., Ome-shi (JP)

( * ) Notice: Subject to any disclaimer, the term of this patent is extended or adjusted under 35 U.S.C. 154(b) by 184 days.

(21) Appl. No.: 12/729,558

(22) Filed: Mar. 23, 2010

(65) Prior Publication Data
US 2010/0244188 A1 Sep. 30, 2010

(30) Foreign Application Priority Data

Mar. 25, 2009 (JP) ................ 2009-075277

(51) Int. Cl.
*H01L 27/08* (2006.01)
(52) U.S. Cl. ...................................... 257/531
(58) Field of Classification Search .......... None
See application file for complete search history.

(56) References Cited

U.S. PATENT DOCUMENTS

| | | | |
|---|---|---|---|
| 6,914,331 B2 | 7/2005 | Shimoishizaka et al. | |
| 7,029,946 B2 | 4/2006 | Murata | |
| 2008/0203527 A1* | 8/2008 | Itoi et al. ............... | 257/531 |

FOREIGN PATENT DOCUMENTS

| | | |
|---|---|---|
| JP | 2003-347410 A | 12/2003 |
| JP | 2004-221297 A | 8/2004 |
| JP | 2006-041357 A | 2/2006 |
| JP | 2008-210828 A | 9/2008 |

OTHER PUBLICATIONS

Japanese Office Action dated Jun. 24, 2011 (and English translation thereof) in counterpart Japanese Application No. 2009-075277.

\* cited by examiner

*Primary Examiner* — Ha Tran T Nguyen
*Assistant Examiner* — Valerie N Brown
(74) *Attorney, Agent, or Firm* — Holtz, Holtz, Goodman & Chick, PC

(57) ABSTRACT

Disclosed is a semiconductor device comprising: a semiconductor substrate in which an integrated circuit is formed; a first resin film provided over the semiconductor substrate; a second resin film provided over an upper surface of the first resin film except at least a peripheral portion of the first resin film; and a thin film inductor provided over the second resin film.

16 Claims, 17 Drawing Sheets

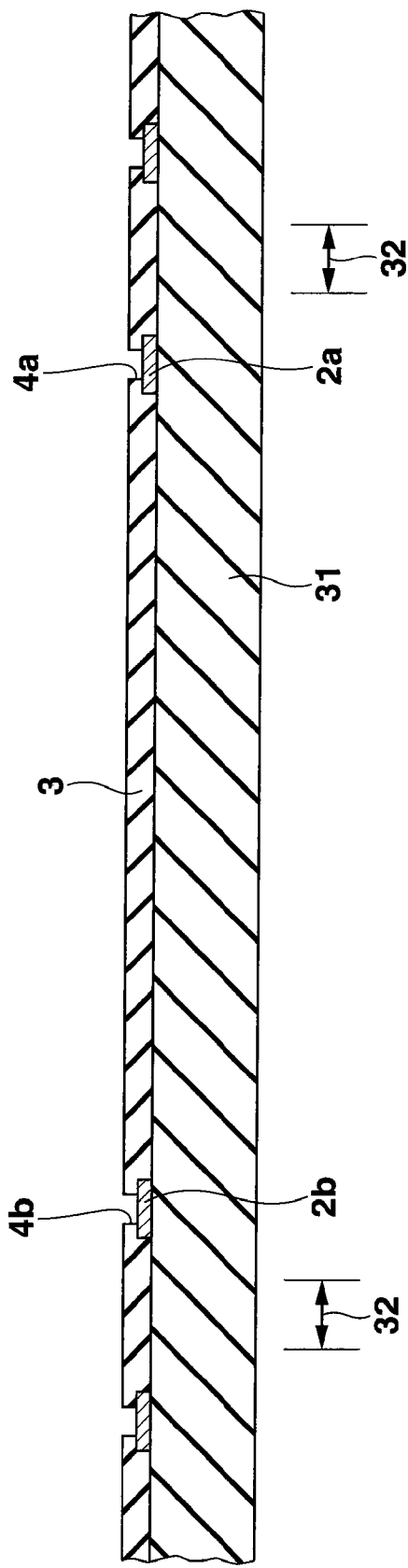

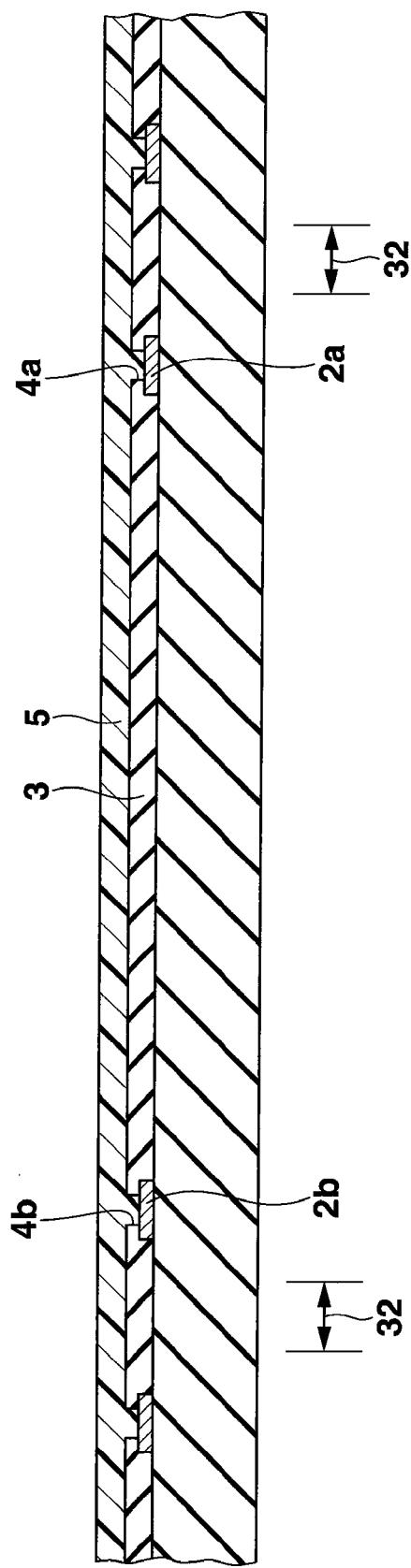

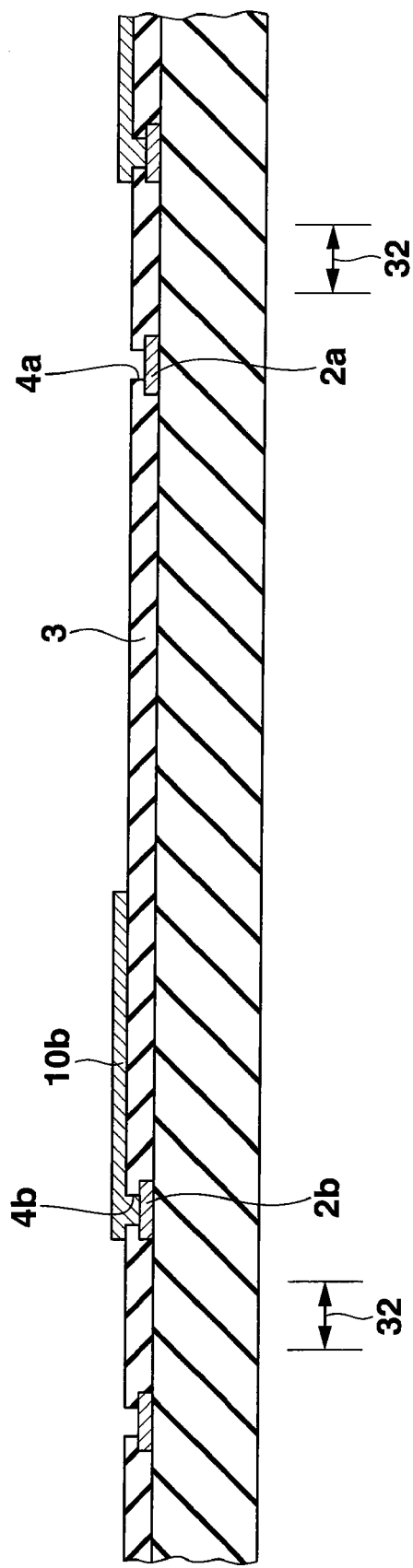

SEMICONDUCTOR DEVICE AND MANUFACTURING METHOD THEREOF

CROSS-REFERENCE TO RELATED APPLICATIONS

This application is based upon and claims the benefit of priority under 35 USC 119 of Japanese Patent Application No. 2009-075277 filed on Mar. 25, 2009, the entire disclosure of which, including the description, claims, drawings, and abstract, is incorporated herein by reference in its entirety.

BACKGROUND OF THE INVENTION

1. Field of the Invention

The present invention relates to a semiconductor device and a manufacturing method of the semiconductor device.

2. Description of the Related Art

Conventionally, a semiconductor device which is equipped with a thin film inductor having a spiral form, referred to as a chip size package (CSP), has been known. Such semiconductor device is disclosed, for example, in Japanese Patent Application Laid-open Publication No. 2008-210828. This semiconductor device comprises a semiconductor substrate. An insulation film is provided on an upper surface of the semiconductor substrate. A plurality of wires and the thin film inductor having the spiral form are provided on an upper surface of the insulation film. A columnar electrode is provided on an upper surface of a connection pad portion of the wires. A sealing film is provided in a state of surrounding the columnar electrode. A solder ball is provided on an upper surface of the columnar electrode.

In such semiconductor device described above, the insulation film comprises a passivation film formed of oxide silicon, and the like, provided on the upper surface of the semiconductor substrate; and a protection film formed of polyimide system resin, and the like, provided on an upper surface of the passivation film. In a case where the wires and the thin film inductor are provided on an upper surface of the protection film, an eddy current is generated in the semiconductor substrate by an induction when a current flows through the wires. Then, an eddy-current loss is generated in the thin film inductor due to the generated eddy current, thereby the property of the thin film inductor is to be degraded.

In order to solve the above mentioned problem, in the semiconductor device disclosed in Japanese Patent Application Laid-open Publication No. 2008-210828, a magnetic film which is formed by mixing soft magnetic powder into a thermosetting resin made of polyimide system resin, and the like, is provided in stead of the protection film formed of the polyimide system resin, and the like, in between the passivation film and the thin film inductor placed on or above the semiconductor substrate. Accordingly, the eddy-current loss of the thin film inductor due to the eddy current generated in the semiconductor substrate is intended to be reduced.

However, in the above described semiconductor device, the magnetic film is manufactured by mixing the soft magnetic power which is a relatively expensive material into the thermosetting resin made of polyimide system resin, and the like, thereby the semiconductor device results in also being relatively expensive. Further, it is difficult to disperse the soft magnetic powder evenly into the thermosetting resin. Here, a circuit may be shunted at a portion where the soft magnetic powder is densely dispersed. On the other hand, the effect of the eddy-current loss being reduced may be deteriorated at a portion where the soft magnetic powder is scarcely dispersed.

SUMMARY OF THE INVENTION

The present invention is advantageous in that a semiconductor device and a manufacturing method of the semiconductor device are provided, wherein the semiconductor device is relatively inexpensive, and is capable of preventing a short circuit, and evenly achieving the effect of reducing the eddy-current loss.

In order to obtain the above mentioned advantage, according to an aspect of the present invention, there is provided a semiconductor device comprising:

a semiconductor substrate in which an integrated circuit is formed;

a first resin film provided over the semiconductor substrate;

a second resin film provided over an upper surface of the first resin film except at least a peripheral portion of the first resin film; and a thin film inductor provided over the second resin film.

In order to obtain the above mentioned advantage, according to another aspect of the present invention, there is provided a manufacturing method of a semiconductor device, comprising:

forming a first resin film over an entire upper surface of a semiconductor substrate in which an integrated circuit is formed, the semiconductor substrate comprising a plurality of connection pads in a peripheral portion to be connected to the integrated circuit;

forming a second resin film in an inward region with respect to the connection pads, over the first resin film; and forming a thin film inductor over the second resin film.

According to the aspects of the present invention, the thin film inductor is provided on the second resin film which is provided over the upper surface of the first resin film except at least the peripheral portion thereof, on the semiconductor substrate. Thus, the eddy-current loss of the thin film inductor due to the eddy current generated in the semiconductor substrate can be reduced because of the total thickness of the first and the second resin films. The second resin film is formed of a resin which is relatively inexpensive, thereby the semiconductor device is relatively inexpensive. Further, the semiconductor device is capable of preventing a short circuit, and evenly achieving the effect of reducing the eddy-current loss.

BRIEF DESCRIPTION OF THE DRAWINGS

The present invention will sufficiently be understood by the following detailed description and accompanied drawings, but they are provided for illustration only, and not for limiting the scope of the invention, and wherein:

FIG. 2 a sectional diagram of what is initially prepared in an example of a manufacturing method of the semiconductor device shown in FIGS. 1A and 1B;

FIG. 3 is a sectional diagram of a step subsequent to FIG. 2;

FIG. 14 a sectional diagram of a predetermined step in an example of a manufacturing method of the semiconductor device shown in FIGS. 13A and 13B;

DETAILED DESCRIPTION OF THE PREFERRED EMBODIMENTS

Hereinbelow, preferred embodiments of the present invention are described with reference to the attached drawings. Although the following embodiments are illustrated to be limited to what is technically preferable in performing the present invention, the scope of the invention is not limited to the embodiments and the appended drawings.

First Embodiment

Figure 1A:
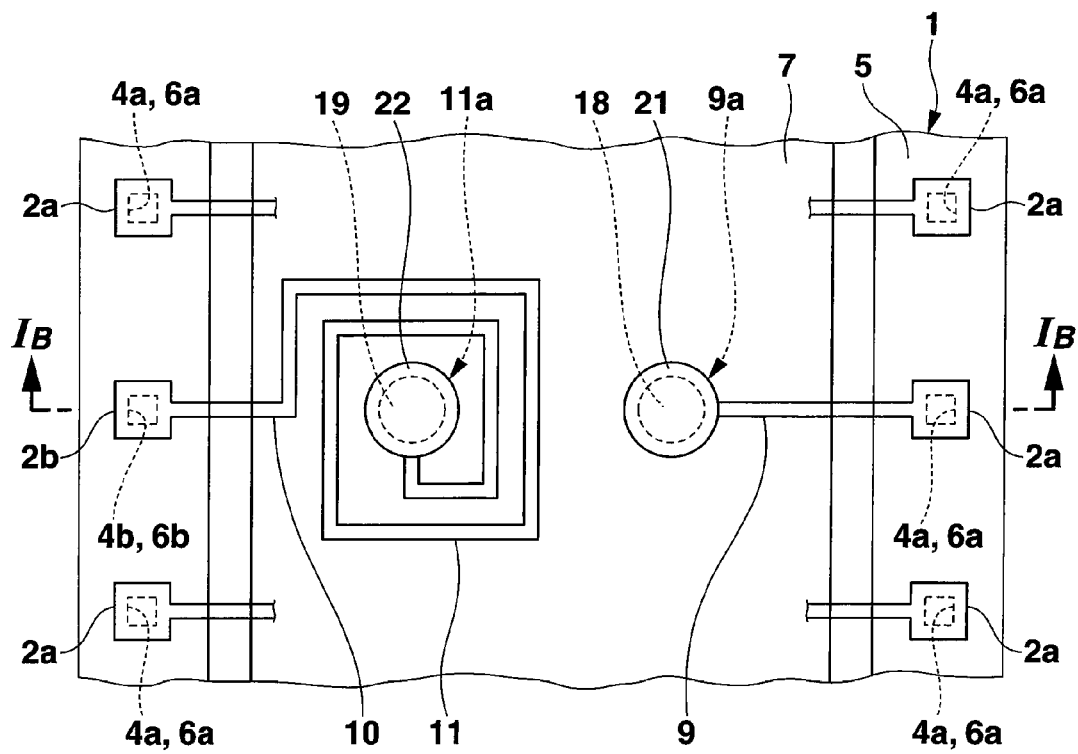
FIG. 1A is a plan view of a main part of a semiconductor device according to a first embodiment of the present invention (which is in a state where a sealing film is removed from the semiconductor device shown in FIG. 1B)
Figure 1B:
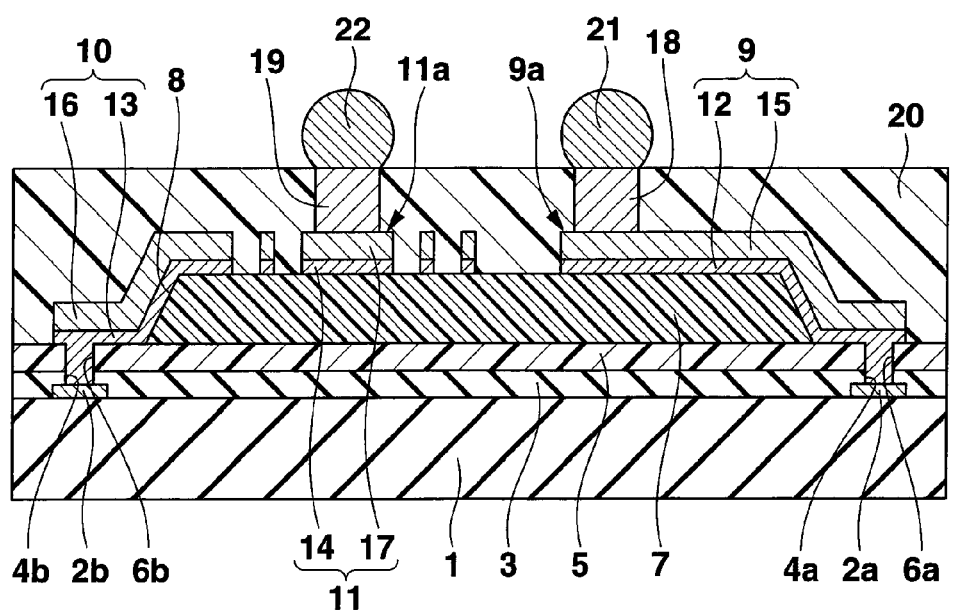
FIG. 1B is a sectional diagram along B-B line of FIG. 1A.

FIG. 1A is a plan view of a main part of a semiconductor device according to a first embodiment of the present invention (which is in a state where a sealing film is removed from the semiconductor device shown in FIG. 1B).

FIG. 1B is a sectional diagram along B-B line of FIG. 1A.

This semiconductor device is what is generally called a chip size package (CSP), and comprises a silicon substrate (semiconductor substrate) 1 having a plane rectangular form. An element which comprises an integrated circuit having predetermined functions such as a circuit element, for example, a transistor, a diode, a resistor, a capacitor, and the like, is provided in an upper surface of the silicon substrate 1. Further, a plurality of connection pads 2a, 2b formed of aluminum system metal, and the like, are provided in the periphery portion of the upper surface so as to be connected to the integrated circuit. In this case, the connection pad shown as the reference character 2b is connected to an external edge portion of a thin film inductor 11 having a spiral form which will be described later.

A passivation film 3 which is formed of oxide silicon, and the like, is provided in the upper surface of the silicon substrate 1 except for each center portion of the connection pads 2a, 2b. Each center portion of the connection pads 2a, 2b is exposed through opening portions 4a, 4b, respectively which are provided in the passivation film 3. A first protection film (a first resin film) 5 which is formed of resin such as polyimide system resin, benzaoxydol, and the like, is provided over the upper surface of the passivation film 3. Opening portions 6a, 6b are provided in the first protection film 5 at portions corresponding to the opening portions 4a, 4b of the passivation film 3, respectively.

A second protection film (a second resin film) 7 is provided in an inward region with respect to the connection pads described above, over the first protection film 5 of the semiconductor substrate 1, that is to say, in a region except the peripheral portions where the opening portions 6a, 6b are provided. The second protection film 7 may be formed of the same resin as that of the first protection film 5. In this case, the side surface of the second protection film 7 is an inclined surface 8.

Here, a thickness of the first protection film 5 is for example, 2-6 μm, and is relatively thin, whereas that of the second protection film 7 is thicker to be for example, approximately 8-14 μm, which is equal to or more than twice the thickness of the first protection film 5. In this case, the total thickness of the first protection film 5 and the second protection film 7 is approximately 10-20 μm, and the thickness of the second protection film 7 does not necessarily have to be thicker than that of the first protection film 5. However, in order for the wires to be densely wired, the thickness of the first protection film 5 where the opening portions 6a, 6b need to formed is preferably as thin as possible.

A plurality of wires 9 and a single wire 10 for the thin film inductor are provided over the upper surface of the peripheral portion of the first protection film 5 and over the upper surface of the second protection film 7 including the inclined surface 8. Thereby, the thin film inductor 11 having a spiral form is provided over the upper surface of the second protection film 7. The wires 9, the wire 10 for the thin film inductor, and the thin film inductor 11 are of a two-layer structure in which upper metallic layers 15, 16, 17 formed of copper are respectively provided on an upper surface of base metallic layers 12, 13, 14 formed of copper, and the like. Incidentally, the spiral form of the thin film inductor 11 shown in FIG. 1A is of a quadrangular shape, however, this may alternatively be a further multiangular shape, a circular shape, an oval shape, a combination of a polygonal shape and a circular shape, and the like. Further, this is not limited to the spiral form, and may alternatively be a ring shape with an approximately single winding.

One edge portion of the wires 9 is connected to the connection pad 2a through the opening portion 4a of the passivation film 3 and the opening portion 6a of the first protection film 5. One edge portion of the wire 10 for the thin film inductor is connected to the connection pad 2b through the opening portion 4b of the passivation film 3 and the opening portion 6b of the first protection film 5. An external edge portion of the thin film inductor 11 is connected to the other edge portion of the wire 10 for the thin film inductor. The other edge portion of the wires 9 and an internal edge portion of the thin film inductor 11 form the connection pad portions 9a, 11a, respectively. In this case, the connection pad portion 9a of the wires 9 is provided only over the upper surface of the second protection film 7.

Columnar electrodes 18, 19 formed of copper are provided on an upper surface of the connection pad portions 9a, 11a of the wires 9 and the thin film inductor 11, respectively. A sealing film 20 formed of epoxy system resin, and the like, is provided over the upper surface peripheral portion of the first protection film 5, the upper surface of the wires 9, the wire 10 for the thin film inductor, and the thin film inductor 11, respectively, and in the upper surface of the second protection film 7 including the inclined surface 8. The columnar electrodes 18, 19 are provided so that the upper surface thereof has a height which ranges from the same height as the upper surface of the sealing film 20, to a height lower by several μm than the upper surface of the sealing film 20. Solder balls 21, 22 are provided on an upper surface of the columnar electrodes 18, 19.

As described above, this semiconductor device comprises the thin film inductor 11 over the upper surface of the second protection film 7 which is placed above the silicon substrate 1 through the passivation film 3 and the first protection film 5. Thereby, the eddy-current loss in the thin film inductor 11 cased by the eddy current generated in the silicon substrate 1 can be decreased, and the deterioration in the property of the thin film inductor 11 can be reduced.

Further, the second protection film 7 is provided over the first protection film 5 where the opening portions 6a, 6b are formed so as to be in connection with the connection pads 2a, 2b, thereby the wires can be densely wired. Moreover, the second protection film 7 is formed of a relatively inexpensive resin such as the polyimide system resin, and the like, thereby the semiconductor device is relatively inexpensive, capable of preventing a short circuit, and evenly achieving the effect of reducing the eddy-current loss.

Next, an example of the manufacturing method of the semiconductor device is described.

First, as shown in FIG. 2, a silicon substrate in a state of a wafer (which is hereinbelow referred to as a semiconductor wafer 31) in a following condition is prepared. That is, the connection pads 2a, 2b formed of aluminum system metal, and the like, and the passivation film 3 formed of oxide silicon, and the like, are respectively formed over the upper surface of the semiconductor wafer 31, and each center portion of the connection pads 2a, 2b is exposed through each of the opening portions 4a, 4b formed in the passivation film 3. Incidentally, a region indicated by the reference number 32 in FIG. 2 is a dicing street.

Next, as shown in FIG. 3, the first protection film 5 formed of resin such as polyimide system resin, polybenzaoxydol, and the like, is formed over the upper surface of the passivation film 3 including the upper surface of the connection pads 2a, 2b exposed through the opening portions 4a, 4b of the passivation film 3, by a screen printing method, a spin coat method, or the like.

Figure 4:
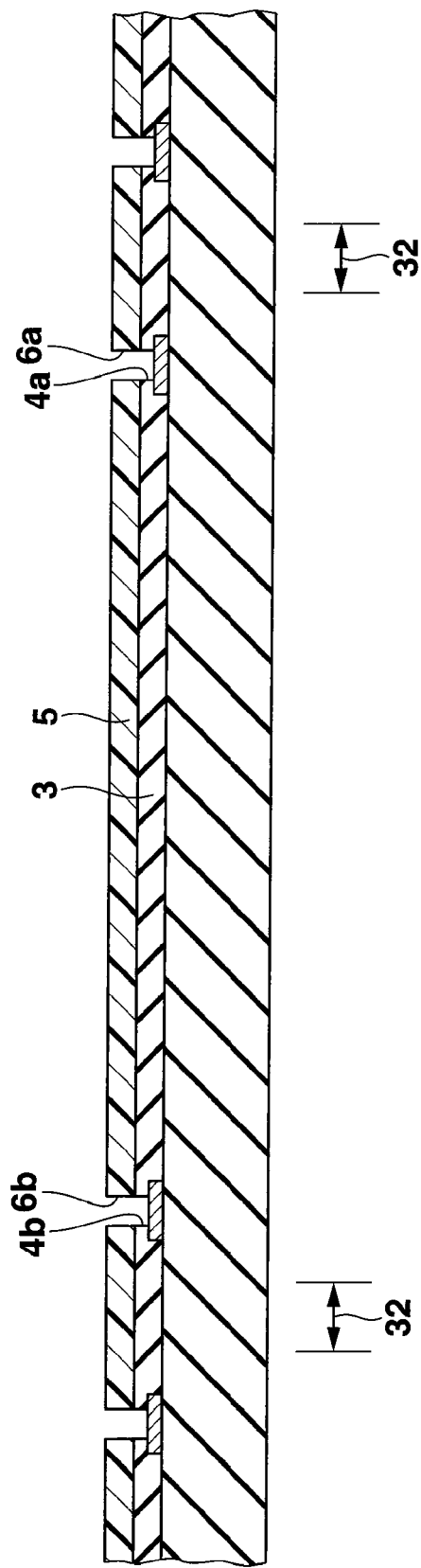
FIG. 4 is a sectional diagram of a step subsequent to FIG. 3.

Next, as shown in FIG. 4, the opening portions 6a, 6b are formed in the first protection film 5 at each portion corresponding to the opening portions 4a, 4b of the passivation film 3, by a photolithographic method.

Figure 5:
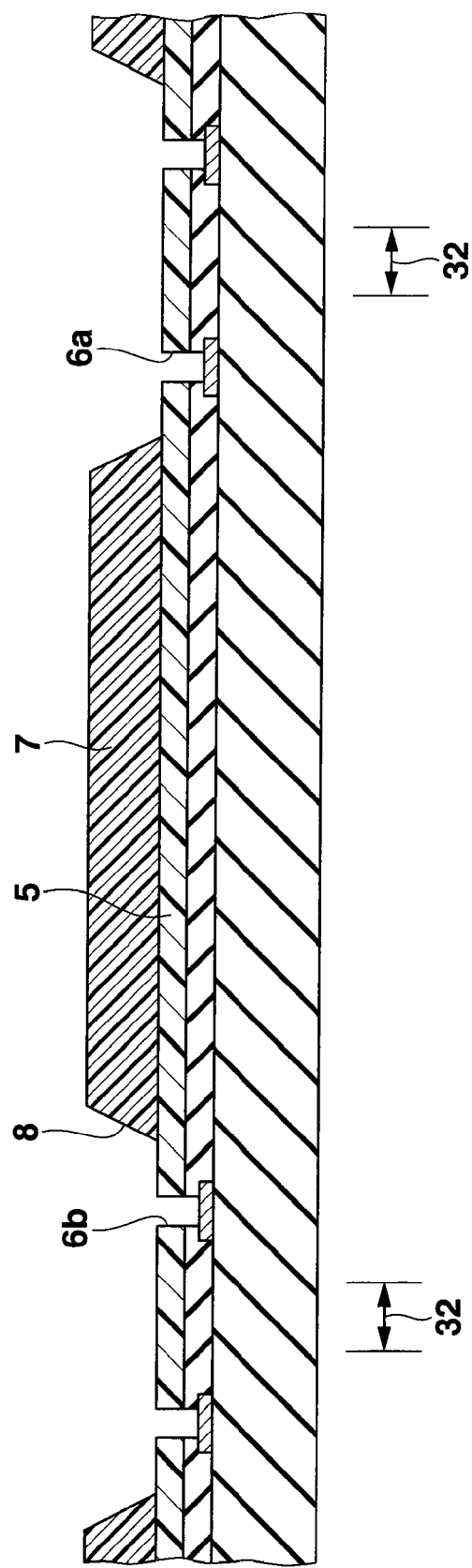
FIG. 5 is a sectional diagram of a step subsequent to FIG. 4.

Next, as shown in FIG. 5, the second protection film 7 formed of either the same resin as the first protection film 5 or a different resin therefrom, is formed over the upper surface of the first protection film 5, except the peripheral portion thereof, that is to say, except the peripheral portion where the opening portions 6a, 6b are formed, in each of the semiconductor device forming region surrounded by the dicing street 32, by the screen printing method. In this case, the peripheral potion of the liquid state resin film applied by the screen printing method slopes down, thereby the side surface of the second protection film 7 forms the inclined surface 8.

Figure 6:
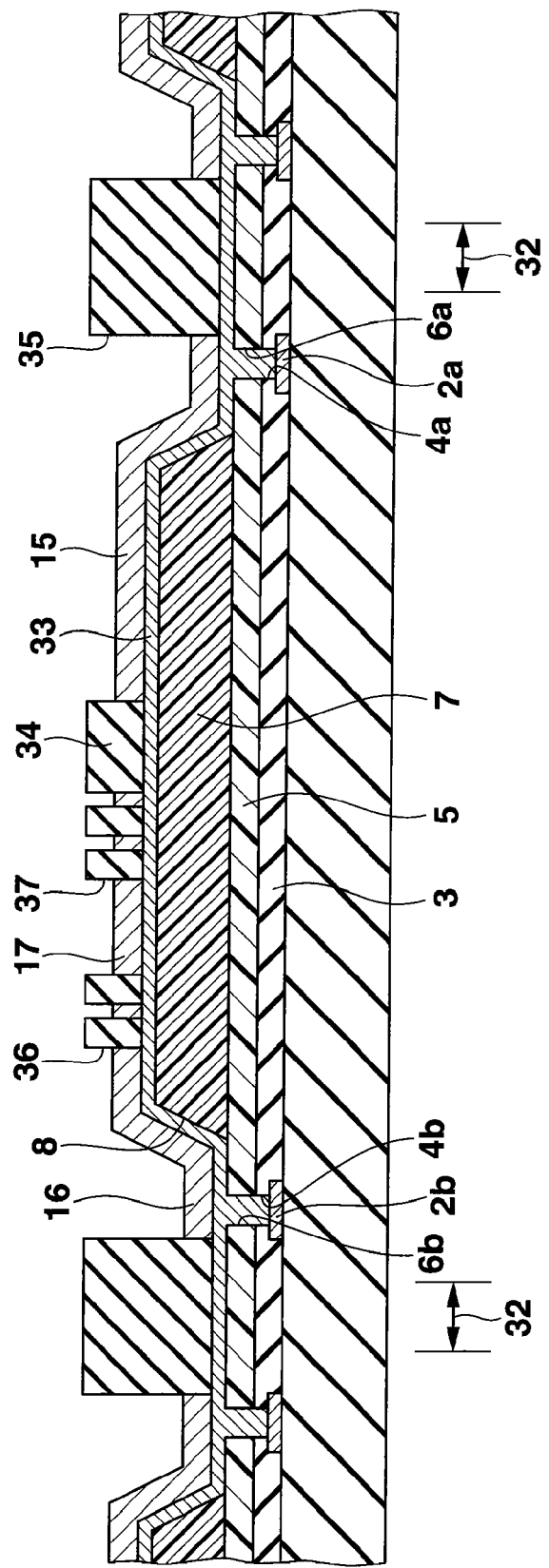
FIG. 6 is a sectional diagram of a step subsequent to FIG. 5.

Next, as shown in FIG. 6, a base metallic layer 33 is formed over the upper surface of the first protection film 5 including the upper surface of the connection pads 2a, 2b exposed through the opening portions 4a, 6a, and opening portions 4b, 6b, of the passivation film 3 and the first protection film 5, respectively; and over the upper surface of the second protection film 7 including the inclined surface 8. In this case, the base metallic layer 33 may either only be a copper layer formed by an electroless plating, only a copper layer formed by a sputtering method, or a thin film layer of titanium, and the like, formed by the sputtering method, further being formed with a copper layer thereon by the sputtering method.

Next, a plated resist film 34 is formed on the upper surface of the base metallic layer 33 by a pattern formation. In this case, opening portions 35, 36, 37 are formed in the plated resist film 34 at each portion corresponding to the region where the upper metallic layers 15, 16, 17 are formed. Next, an electroplating of copper is performed in a state where the base metallic layer 33 is a plating current path, thereby the upper metallic layers 15, 16, 17 are formed on the upper surface of the base metallic layer 33 inside the opening portions 35, 36, 37 of the plated resist film 34. Next, the plated resist film 34 is peeled off.

Figure 7:
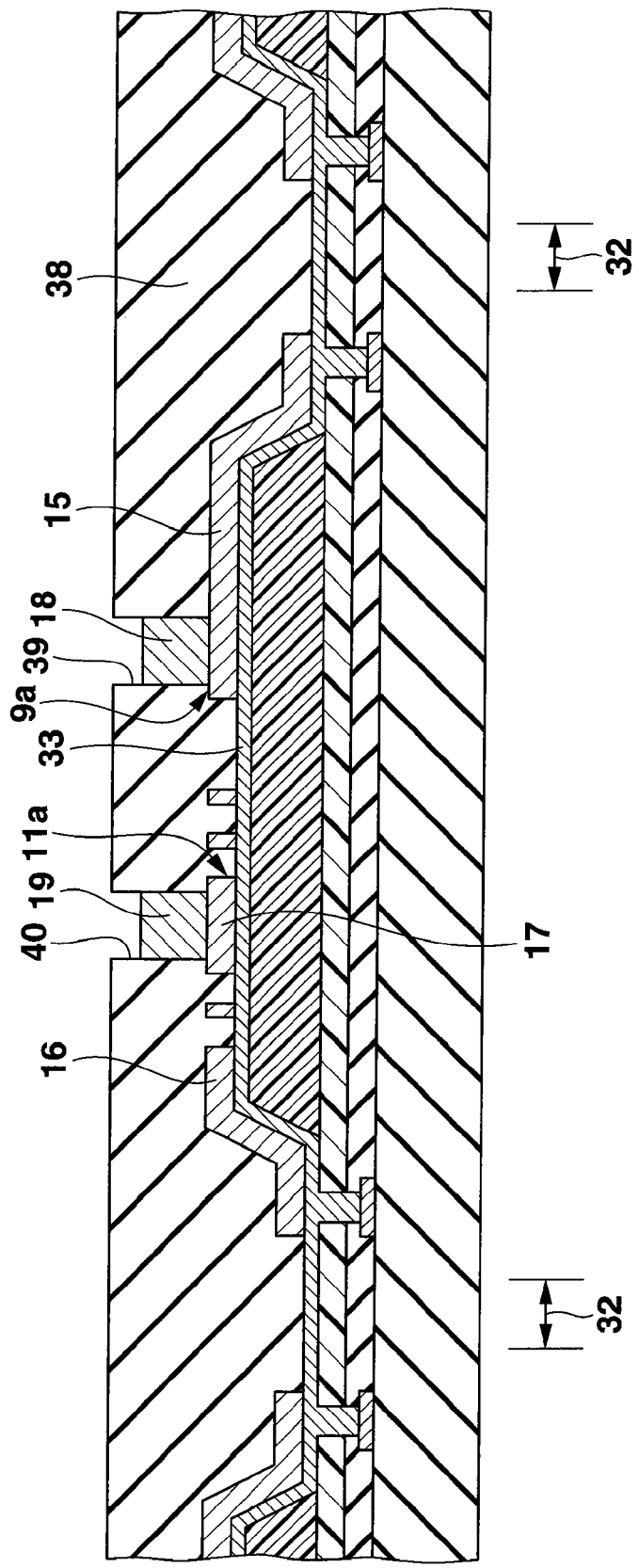
FIG. 7 is a sectional diagram of a step subsequent to FIG. 6.

Next, as shown in FIG. 7, a plated resist film 38 is formed on the upper surface of the upper metallic layers 15, 16, 17 and of the base metallic layer 33 by the pattern formation. In this case, opening portions 39, 40 are formed in the plated resist film 38 at each portion corresponding to the connection pad portions 9a, 11a of the upper metallic layers 15, 17, that is to say, at each portion corresponding to the region where the columnar electrodes 18, 19 are to be formed. Next, an electroplating of copper is performed in a state where the base metallic layer 33 is a plating current path, thereby the columnar electrodes 18, 19 are formed on the upper surface of the connection pad portions 9a, 11a of the upper metallic layers 15, 17 inside the opening portions 39, 40 of the plated resist film 38.

Figure 8:
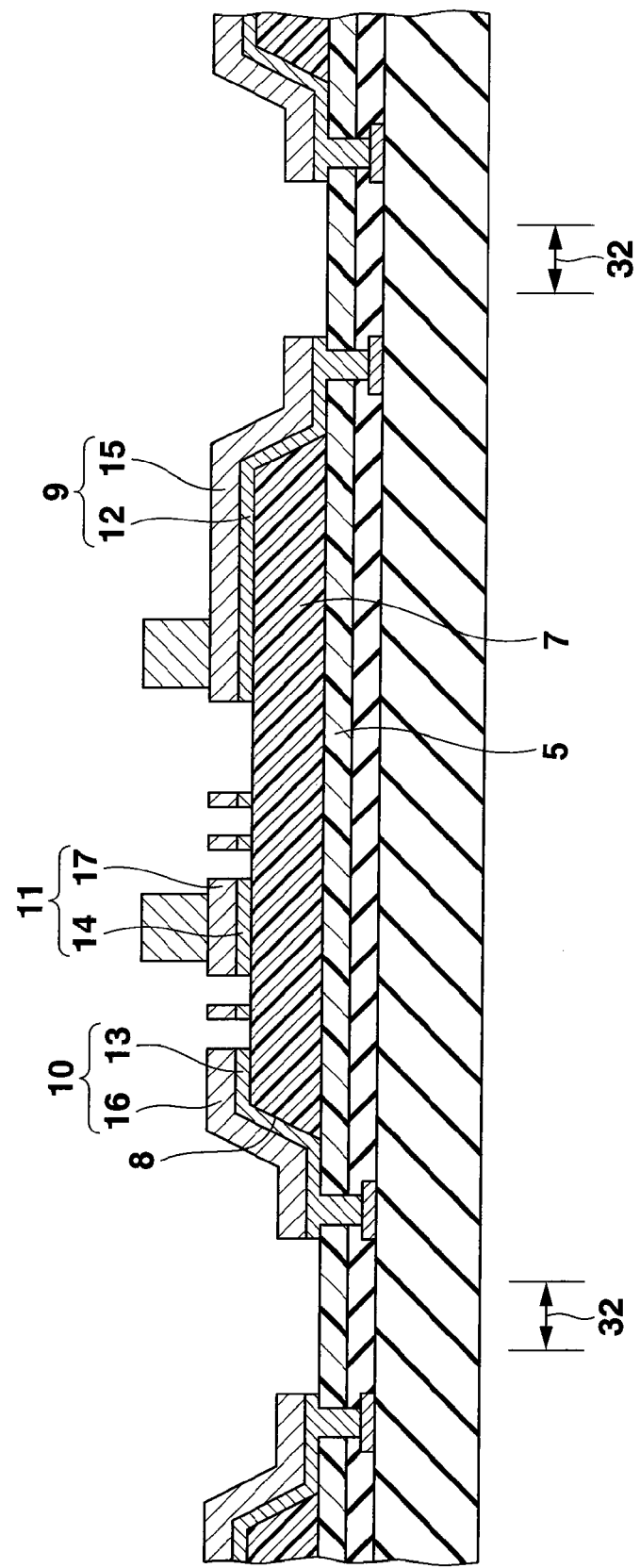
FIG. 8 is a sectional diagram of a step subsequent to FIG. 7.

Next, the plated resist film 38 is peeled off, and then unnecessary portions of the base metallic layer 33 is removed by etching in a state where the upper metallic layers 15, 16, 17 function as a mask. Thereby, as shown in FIG. 8, the base metallic layers 12, 13, 14 remain only in the portions under the upper metallic layers 15, 16, 17. In this state, the wires 9, the wire 10 for the thin film inductor, and the thin film inductor 11, respectively having a two layer structure, are formed by the upper metallic layers 15, 16, 17 and the base metallic layers 12, 13, 14 which remain underneath.

Incidentally, a case where the wires 9, the wire 10 for the thin film inductor, and the thin film inductor 11 are formed by a semi-additive method is described in the above example, however, they can alternatively be formed by a subtract method. In such a case, the base metallic layer 33 is formed over the upper surface of the first protection film 5 including the upper surface of the connection pads 2a, 2b exposed through the opening portions 4a, 6a, and opening portions 4b, 6b, of the passivation film 3 and the first protection film 5, respectively; and in the upper surface of the second protection film 7 including the inclined surface 8, as shown in FIG. 6. Subsequently, an upper metallic forming layer is formed on the entire upper surface of the base metallic layer 33 by the electroplating method. Subsequently, a photoresist mask is formed on the region where the upper portions 15, 16, 17 are formed on the upper metallic forming layer. Then, the region where the upper metallic forming layer and the base metallic layer 33 are exposed from the photoresist mask is performed with etching. However, the etching is performed after the columnar electrodes 18, 19 have been formed, as shown in FIG. 7 (wherein in the case of the subtract method, on the other hand, the upper metallic forming layer, instead of the upper metallic layers 15, 16, 17 is formed on the entire surface of the base metallic layer 33.)

Here, the wires 9 and the wire 10 for the thin film inductor are formed on or above the upper surface of the first and second protection films 5, 7. The side surface of the second protection film 7 is formed with the inclined surface 8, thereby it is difficult for the wires 9 and the wire 10 for the thin film inductor to be disconnected. Further, as shown in FIG. 6, the base metallic layer 33 can be preferably formed when being formed on the entire upper surface.

Figure 9:
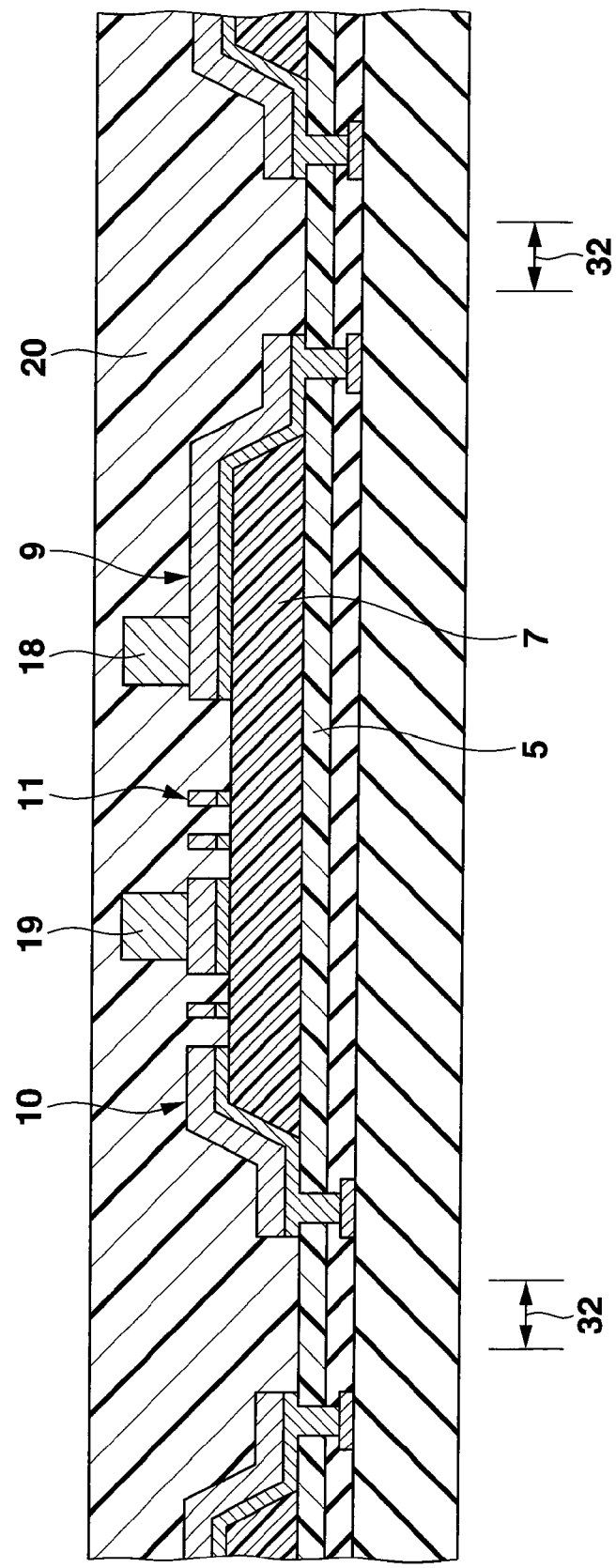
FIG. 9 is a sectional diagram of a step subsequent to FIG. 8.

Next, as shown in FIG. 9, the sealing film 20 formed of epoxy system resin, and the like, is formed on or above the upper surface of the first and second protection films 5, 7, including the upper surface of the wires 9, the wire 10 for the thin film inductor, the thin film inductor 11, and the columnar electrodes 18, 19, by the screen printing method, the spin coat method, or the like, so that the thickness of the sealing film 20 is thicker than the height of the columnar electrodes 18, 19. Accordingly, in this state, the upper surface of the columnar electrodes 18, 19 is covered with the sealing film 20.

Figure 10:
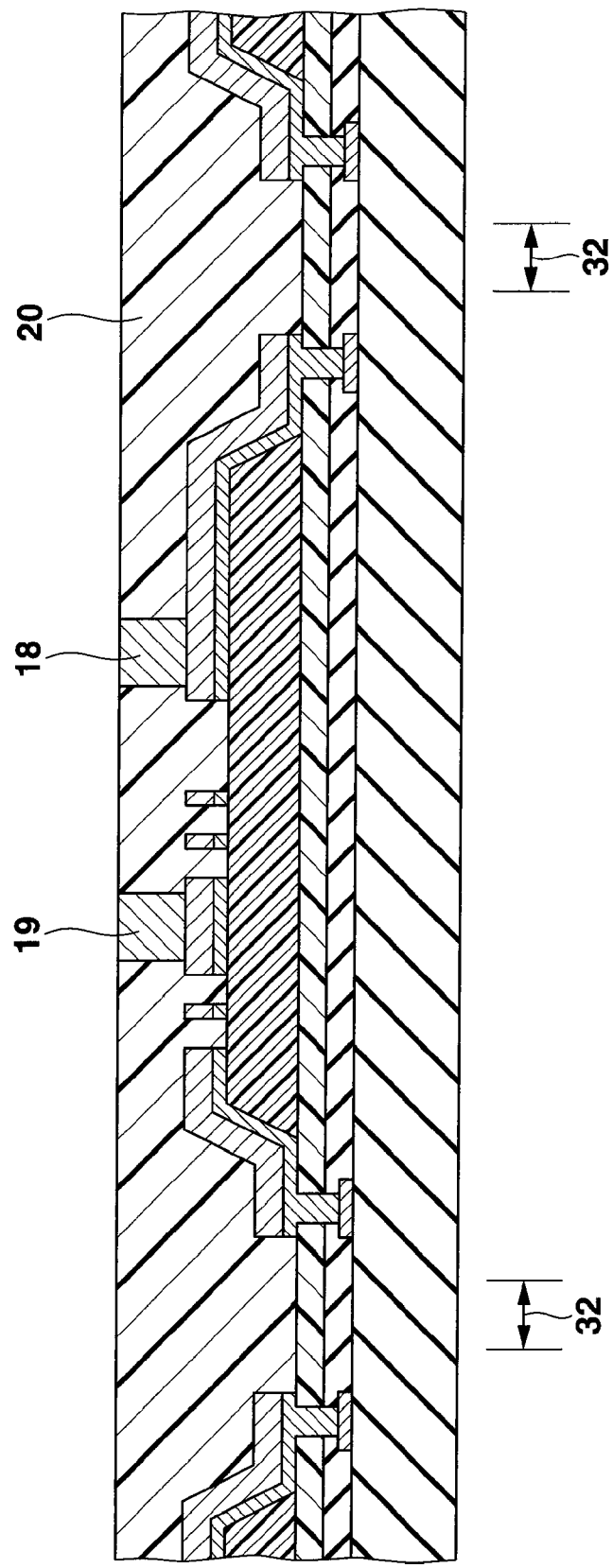
FIG. 10 is a sectional diagram of a step subsequent to FIG. 9.

Next, the upper surface side of the sealing film 20 is suitably ground so that the upper surface of the columnar electrodes 18, 19 is exposed, and the upper surface of the sealing film 20 including the exposed upper surface of the columnar electrodes 18, 19 is planarized, as shown in FIG. 10.

Figure 11:
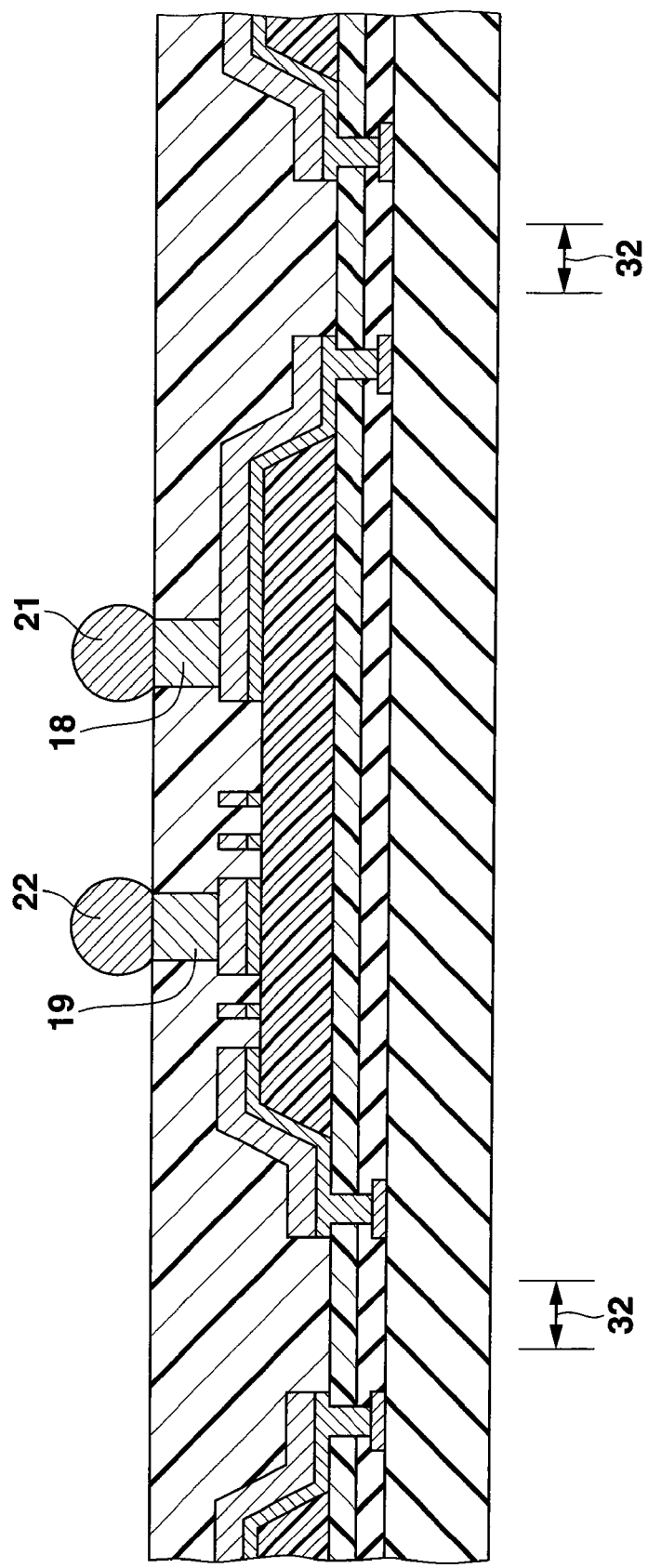
FIG. 11 is a sectional diagram of a step subsequent to FIG. 10.

Next, as shown in FIG. 11, the solder balls 21, 22 are formed on the upper surface of the columnar electrodes 18, 19.

Figure 12:
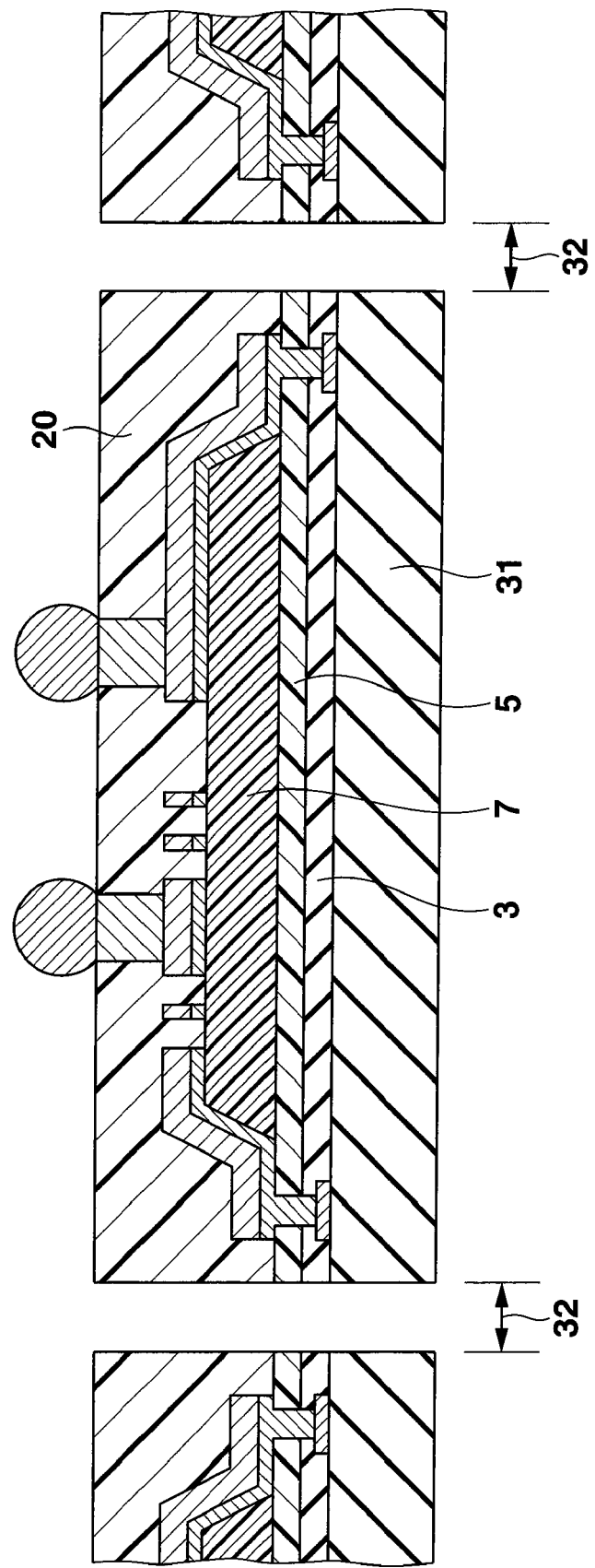
FIG. 12 is a sectional diagram of a step subsequent to FIG. 11.

Next, as shown in FIG. 12, the sealing film 20, the first protection film 5, the passivation film 3, and the semiconductor wafer 31 are cut along the dicing street 32, thereby a plurality of semiconductor devices shown in FIGS. 1A, 1B are obtained.

Here, as shown in FIG. 5, the reason why the second protection film 7 is not formed over the entire upper surface of the first protection film 5 but is formed over the upper surface of the first protection film 5, except the peripheral portion thereof, that is to say, except the peripheral portion where the opening portions 6a, 6b are formed, in each of the semiconductor device forming region surrounded by the dicing street 32, is explained. Further, the thickness of the first and the second protection films 5, 7 is also described.

In a case where the second protection film 7 is formed over the entire upper surface of the first protection film 5, in order to expose the connection pads 2a, 2b, opening portions need to be formed in the second protection film 7 at each portion corresponding to the opening portions 6a, 6b of the first protection film 5. However, when the pitch and the plane size of the connection pads 2a, 2b are reduced in accordance with the miniaturization, the pitch and the plane size of the opening portions 6a, 6b of the first protection film 7, and of the opening portions to be formed in the second protection film 7 at each portion corresponding to the opening portions 6a, 6b also have to be reduced accordingly. When these opening portions are formed by the photolithographic method, the total thickness of the first and the second protection films 5, 7 is to be rather thick, thereby the resolution is reduced, which is not preferable.

Thus, when the second protection film 7 is not formed over the entire upper surface of the first protection film 5 but is formed over the upper surface of the first protection film 5, except the peripheral portion thereof, that is to say, except the peripheral portion where the opening portions 6a, 6b are formed, in each of the semiconductor device forming region surrounded by the dicing street 32, as in this embodiment, the opening portions 6a, 6b may be formed only in the first protection film 5 which has a relatively thin thickness of, for example, 2-6 μm, thereby enabling the miniaturization. However, the thickness of the first protection film 5 is not limited to this. Further, as described above, the total thickness of the first protection film 5 and the second protection film 7 may be approximately 10-20 μm in order to obtain the effect of reducing the eddy-current loss, thus the thickness of the second protection film 7 is determined according to the thickness of the first protection film 5.

Second Embodiment

Figure 13A:
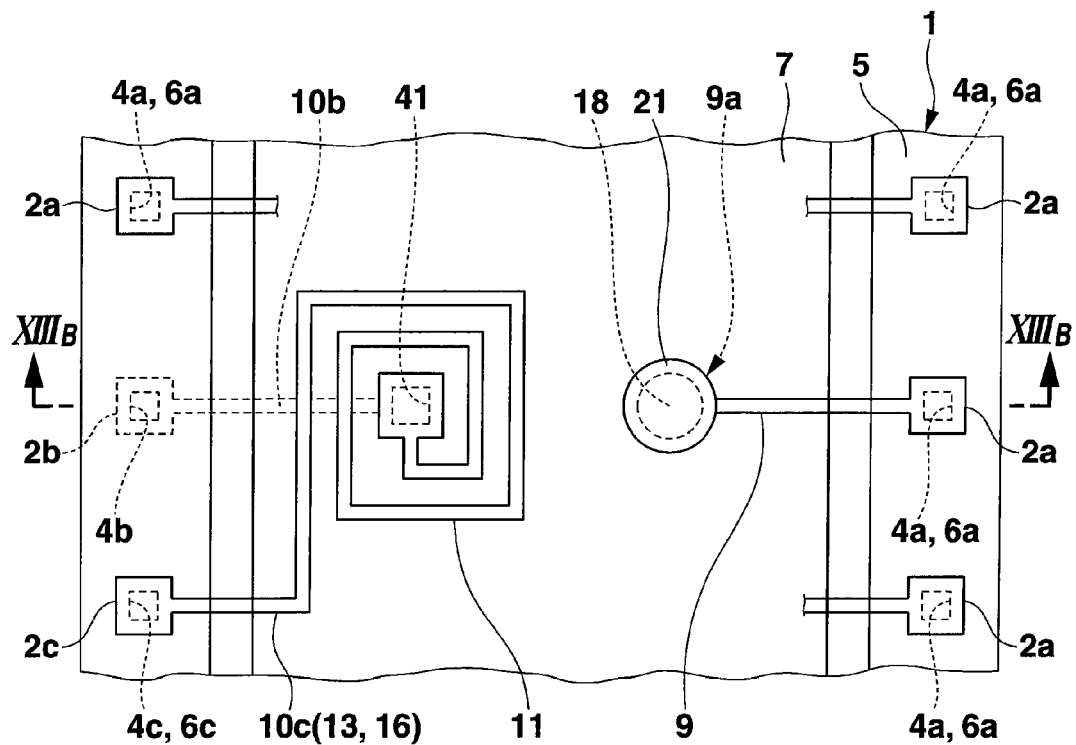
FIG. 13A is a plan view of a main part of a semiconductor device according to a second embodiment of the present invention (which is in a state where a sealing film is removed from the semiconductor device shown in FIG. 13B)
Figure 13B:
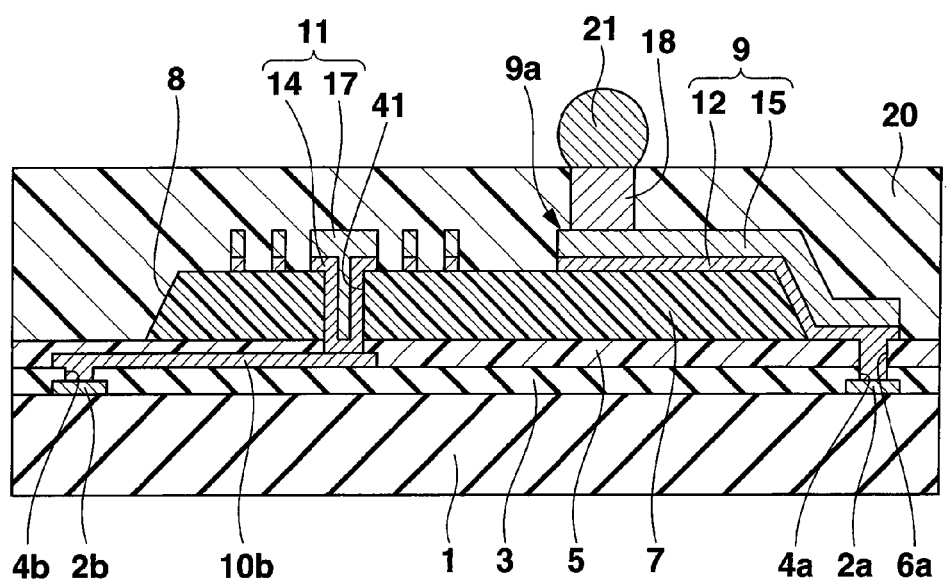
FIG. 13B is a sectional diagram along B-B line of FIG. 13A.

FIG. 13A is a plan view of a main part of a semiconductor device according to a second embodiment of the present invention (which is in a state where a sealing film is removed from the semiconductor device shown in FIG. 13B).

FIG. 13B is a sectional diagram along B-B line of FIG. 13A.

The remarkable difference of this semiconductor device from the semiconductor device shown in FIGS. 1A, 1B is that not only the external edge portion but also the internal edge portion of the thin film inductor 11 having the spiral form is connected to the connection pads which is connected to the integrated circuit formed on the upper surface of the silicon substrate 1.

That is to say, the connection pads indicated by the reference characters 2b, 2c are connected to the internal edge portion and the external edge portion of the thin film inductor 11 having the spiral form. In FIG. 13A, the connection pads 2b, 2c are disposed in a state of being adjacent to each other. The passivation film 3 is provided over the upper surface of the silicon substrate 1 except the center portion of each of the connection pads 2a, 2b, 2c, and the center portion of each of the connection pads 2a, 2b, 2c is exposed through the opening portions 4a, 4b, 4c provided in the passivation film 3.

A wire 10b for the thin film inductor (lower layer) formed of a metal which is different from what the connection pads 2a, 2b, 2c are formed of, for example, chrome system metal, is provided on the upper surface of the passivation film 3. One edge portion of the wire 10b for the thin film inductor is connected to the connection pad 2b through the opening portion 4b of the passivation film 3. The first protection film 5 is provided over the upper surface of the passivation film 3 including the upper surface of the wire 10b for the thin film inductor. The opening portions 6a, 6c are provided in the first protection film 5 at each portion corresponding to the opening portions 4a, 4c of the passivation film 3.

The second protection film 7 is provided over the upper surface of the first protection film 5 except the peripheral portion thereof, that is to say, except the peripheral portion where the opening portions 6a, 6c are provided. The side surface of the second protection film 7 is formed to be the inclined surface 8, also in this case. Further, the thickness of the first protection film 5 and the second protection film 7 is set in the same manner as in the first embodiment. Here, the opening portion 41 is provided in the first and the second protection films 5, 7 at a portion corresponding to the connection pad portion of the wire 10b for the thin film inductor.

A plurality of wires 9 and a single wire 10c for the thin film inductor are provided over the upper surface of the peripheral portion of the first protection film 5 and over the upper surface of the second protection film 7 including the inclined surface 8. Thereby, the thin film inductor 11 having a spiral form is provided over the upper surface of the second protection film 7. The wires 9, the wire 10c for the thin film inductor, and the thin film inductor 11 are of a two-layer structure in which upper metallic layers 15, 16, 17 are respectively provided on an upper surface of base metallic layers 12, 13, 14.

One edge portion of the wires 9 is connected to the connection pad 2a through the opening portion 4a, 6a of the passivation film 3 and the first protection film 5, respectively. One edge portion of the wire 10c for the thin film inductor is connected to the connection pad 2c through the opening portion 4c, 6c of the passivation film 3, and the first protection film 5, respectively. The internal edge portion of the thin film inductor 11 is connected to the connection pad portion of the wire 10b for the thin film inductor through the opening portion 41 of the first and the second protection films 5, 7. The external edge portion of the thin film inductor 11 is connected to the other edge portion of the wire 10c for the thin film inductor.

The columnar electrode 18 is provided on an upper surface of the connection pad portion 9a of the wires 9. A sealing film 20 is provided over the upper surface peripheral portion of the first protection film 5, the upper surface of the wires 9, the wire 10c for the thin film inductor, and the thin film inductor 11, respectively, and in the upper surface of the second protection film 7 including the inclined surface 8. Solder ball 21 is provided on an upper surface of the columnar electrode 18.

As described above, this semiconductor device as in the second embodiment also comprises the thin film inductor 11 over the upper surface of the second protection film 7 which is placed above the silicon substrate 1 through the passivation film 3 and the first protection film 5. Thereby, the eddy-current loss in the thin film inductor 11 cased by the eddy current generated in the silicon substrate 1 can be decreased, and the deterioration in the property of the thin film inductor 11 can be reduced.

Next, an example of a manufacturing method of this semiconductor device is described.

In this case, after what is shown in FIG. 2 has been prepared, as shown in FIG. 14, the wire 10b for the thin film inductor is formed over the upper surface of the passivation film 3, by performing a patterning for a metallic film by the photolithographic method, wherein the metallic film is formed of chrome system metal, and the like, by the sputtering method, and the like. In this state, one edge portion of the wire 10b for the thin film inductor is connected to the connection pad 2b through the opening portion 4b of the passivation film 3.

Here, the reason why the wire 10b for the thin film inductor is formed of a metal different from what the connection pads 2a, 2b are formed of is that since the connection pad 2a is exposed through the opening portion 4a of the passivation film 3, the exposed connection pad 2a is intended not to be performed with etching. Incidentally, the description for the connection pad indicated as the reference character 2c is omitted in FIG. 13A.

Figure 15:
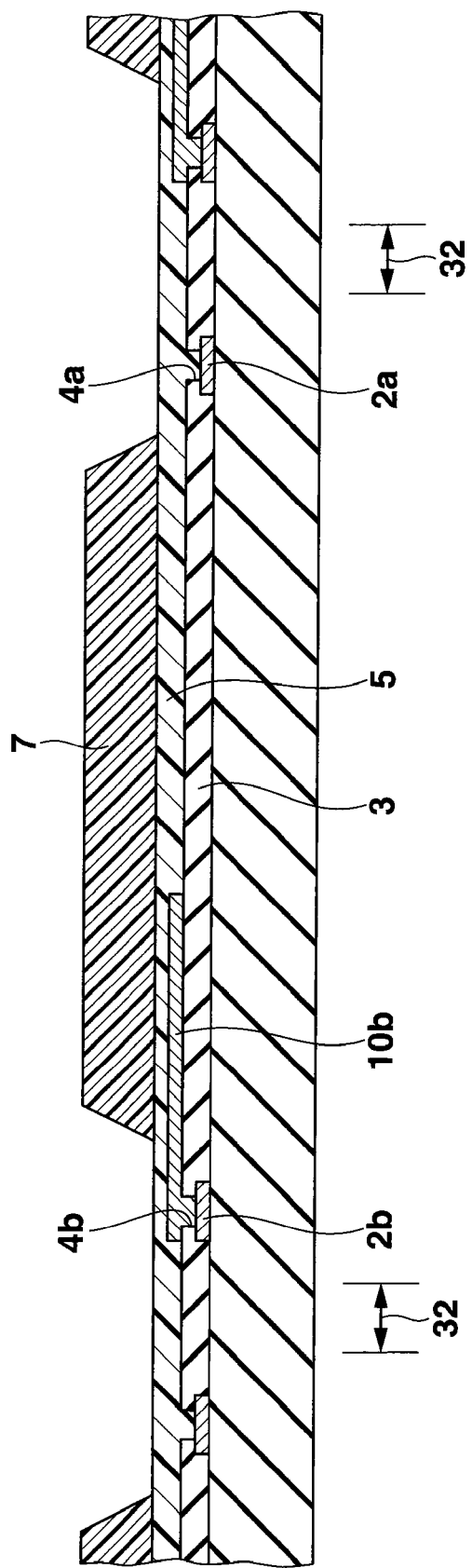
FIG. 15 is a sectional diagram of a step subsequent to FIG. 14.

Next, as shown in FIG. 15, the first protection film 5 is formed over the upper surface of the passivation film 3, including the upper surface of the connection pad 2a exposed through the opening portion 4a of the passivation film 3, and of the wire 10b for the thin film inductor, by the screen printing method, the spin coat method, or the like. Next, the second protection film 7 is formed over the upper surface of the first protection film 5 except the peripheral portion thereof, in each semiconductor device forming region surrounded by the dicing street 32, by the screen printing method. Also in this case, the peripheral potion of the liquid state resin film applied by the screen printing method slopes down, thereby the side surface of the second protection film 7 forms the inclined surface 8.

Figure 16:
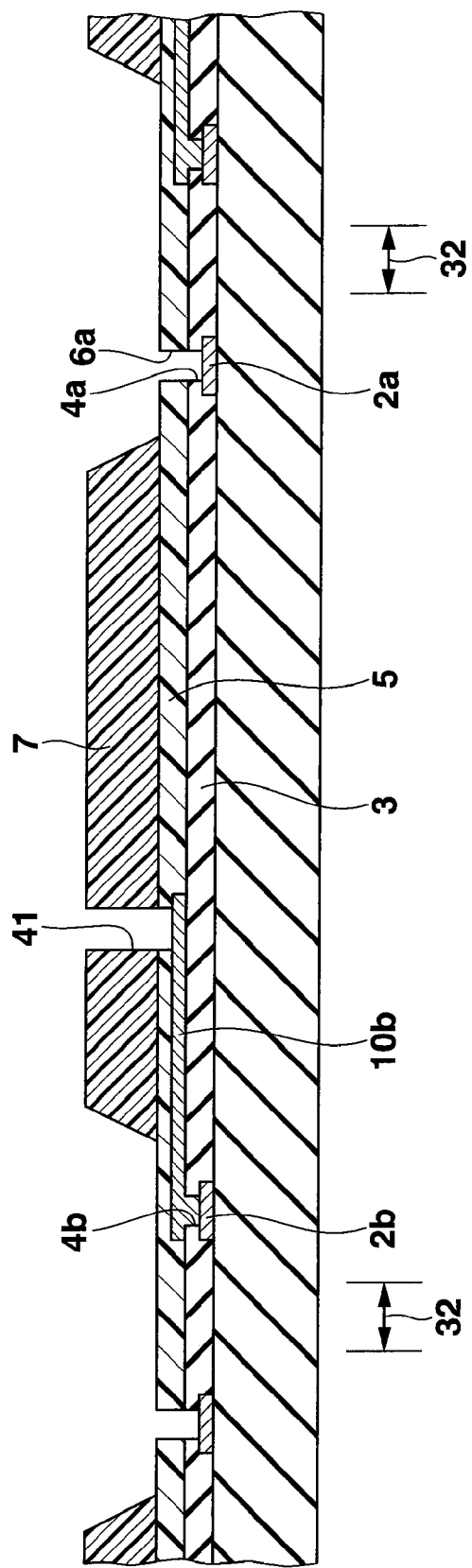
FIG. 16 is a sectional diagram of a step subsequent to FIG. 15.

Next, as shown in FIG. 16, the opening portion 6a is formed in the first protection film 5 at the portion corresponding to the opening portion 2a of the passivation film 3, by the photolithographic method. The opening portion 41 is formed in the first and the second protection films 5, 7 at the portion corresponding to the connection pad portion of the wire 10b for the thin film inductor. In this case, since the opening portion 41 formed in the first and the second protection films 5, 7 has no relation with the miniaturization of the connection pads 2a, 2b, there is no problem in making the plane size of the opening portion 41 relatively large, in view of the resolution.

Figure 17:
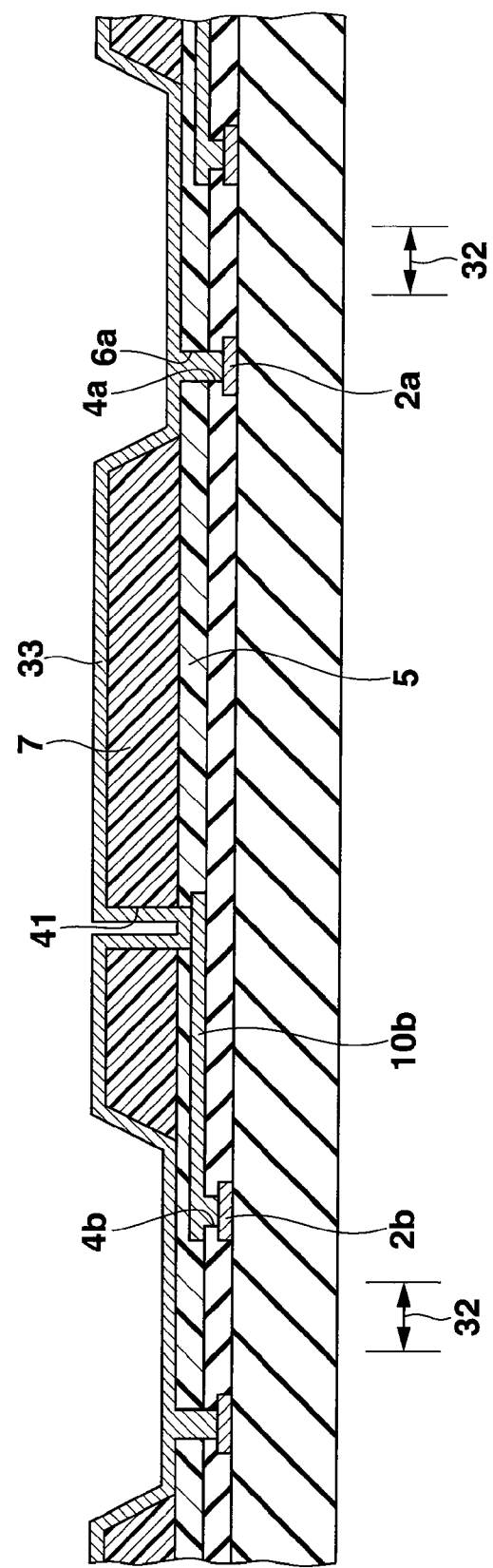
FIG. 17 is a sectional diagram of a step subsequent to FIG. 16.

Next, as shown in FIG. 17, the base metallic layer 33 is formed over the upper surface of the first protection film 5 including the upper surface of the connection pad 2a exposed through the opening portions 4a, 6a of the passivation film 3 and the first protection film 5, respectively; and in the upper surface of the second protection film 7 including: the upper surface of the connection pad portion of the wire 10 for the thin film inductor exposed through the opening portion 41 of the first and the second protection films 5, 7; and the upper surface of the inclined surface 8. Hereinafter, the same steps as those in the first embodiment are performed, thereby a plurality of semiconductor devices as shown in FIGS. 13A, 13B are obtained.

Incidentally, in the second embodiment, the wire 10b for the thin film inductor has been described to be different in its material and structure from the wire 10c for the thin film inductor. However, both of the wires may of course share the same material and structure. In that case, in the step in which the metallic film is performed with the patterning by the photolithographic method to form the wire 10b for the thin film inductor, which is shown in FIG. 14, the patterning of the metallic film by the photolithographic method may be performed after the mask has been formed on the connection pad 2a so that the connection pad 2a is not performed with etching.

Further, in the above embodiments, the case in which the second protection film 7 is formed over the upper surface of the first protection film 5, except the peripheral portion thereof, that is to say, except the peripheral portion where the opening portions 6a, 6b are formed, in each of the semiconductor device forming region surrounded by the dicing street 32, has been described, however the present invention is not limited to this case. For example, the second protection film 7 may alternatively be formed only over the upper surface of the first protection film 5 at a portion corresponding to the region where the thin film inductor 11 is formed.

Further, the case in which the second protection film 7 is formed by the screen printing has been described. However, the second protection film 7 may alternatively be formed by being attached to the entire upper surface of the first protection film 5 by the spin coating, the application, the screen printing method, or the like, and then being performed by wet etching. In this case, isotropic etching solution may be used so that the side surface of the second protection film 7 may have an inclined surface with a preferable angle.

What is claimed is:

1. A semiconductor device comprising:
   a semiconductor substrate in which a plurality of connection pads are respectively provided at a peripheral portion of the semiconductor substrate;
   a first resin film provided over the semiconductor substrate;
   a second resin film provided over an upper surface of the first resin film except at least a peripheral portion of the first resin film;
   a thin film inductor provided over the second resin film;
   a first wire provided over the first resin film and the second resin film, one end portion of the first wire being connected to one of the connection pads;
   a second wire provided over the first resin film and the second resin film, one end portion of the second wire being connected to another connection pad, and the other end portion of the second wire being connected to an outer edge portion of the thin film inductor; and columnar electrodes respectively provided on one of the connection pads to which the first wire is connected and on an inner edge portion of the thin film inductor.

2. The semiconductor device as claimed in claim 1, wherein a side surface of the second resin film is an inclined surface.

3. The semiconductor device as claimed in claim 1, wherein the plurality of connection pads are connected to an integrated circuit formed in the semiconductor substrate, and wherein the second resin film is provided over an inward region with respect to the connection pads on the semiconductor substrate.

4. The semiconductor device as claimed in claim 3, wherein a thickness of the second resin film is thicker than a thickness of the first resin film.

5. The semiconductor device as claimed in claim 4, wherein a total thickness of the thickness of the first resin film and the thickness of the second resin film ranges from 10-20 µm.

6. The semiconductor device as claimed in claim 5, wherein the thickness of the second resin film is equal to or more than twice the thickness of the first resin film.

7. The semiconductor device as claimed in claim 6, wherein the thickness of the first resin film ranges from 2-6 µm.

8. The semiconductor device as claimed in claim 1, further comprising a lower layer wire for the thin film inductor provided under the first resin film,
wherein one end portion of the lower layer wire is connected to one of the connection pads, and the other end portion of the lower layer wire is connected to an inner edge portion of the thin film inductor through opening portions respectively provided in the first resin film and in the second resin film.

9. A manufacturing method of a semiconductor device, the method comprising:
forming a first resin film over an entire upper surface of a semiconductor substrate in which an integrated circuit is formed, the semiconductor substrate comprising a plurality of connection pads respectively provided at a peripheral portion of the semiconductor substrate to be connected to the integrated circuit;
forming a second resin film in an inward region with respect to the connection pads, over the first resin film; and
forming a thin film inductor over the second resin film
forming a first wire over the first resin film and the second resin film, one end portion of the first wire being connected to one of the connection pads;
forming a second wire over the first resin film and the second resin film, one end portion of the second wire being connected to another connection pad, and the other end portion of the second wire being connected to an outer edge portion of the thin film inductor; and
forming columnar electrodes respectively on one of the connection pads to which the first wire is connected and on an inner edge portion of the thin film inductor.

10. The manufacturing method as claimed in claim 9, wherein forming the second resin film comprises forming the second resin film so as to be thicker than the first resin film.

11. The manufacturing method as claimed in claim 10, wherein forming the second resin film comprises making a total thickness of a thickness of the first resin film and a thickness of the second resin film range from 10-20 µm.

12. The manufacturing method as claimed in claim 11, wherein forming the second resin film comprises making the thickness of the second resin film equal to or more than twice the thickness of the first resin film.

13. The manufacturing method as claimed in claim 12, wherein forming the first resin film comprises making the thickness of the first resin film range from 2-6 µm.

14. The manufacturing method as claimed in claim 13, further comprising:
forming, by a photolithographic method, an opening portion in the first resin film at each portion corresponding to the plurality of connection pads formed in the peripheral portion of the semiconductor substrate,
wherein forming the opening portion is performed after forming the first resin film, and before forming the second resin film.

15. The manufacturing method as claimed in claim 9, wherein the second resin film is formed by a screen printing method.

16. The manufacturing method as claimed in claim 15, wherein forming the second resin film by the screen printing method comprises making a side surface of a liquid state resin film applied by the screen printing method slope down such that a side surface of the second resin film is formed to be an inclined surface.

* * * * *